US 8,772,775 B2

(12) United States Patent
Park et al.

(10) Patent No.: US 8,772,775 B2
(45) Date of Patent: Jul. 8, 2014

(54) DISPLAY DEVICE AND METHOD FOR MANUFACTURING THE SAME

(75) Inventors: Joung-Keun Park, Yongin (KR); Jae-Hyuk Jang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 347 days.

(21) Appl. No.: 13/092,846

(22) Filed: Apr. 22, 2011

(65) Prior Publication Data

US 2012/0091460 A1 Apr. 19, 2012

(30) Foreign Application Priority Data

Oct. 18, 2010 (KR) .................. 10-2010-0101414

(51) Int. Cl.
*H01L 29/04* (2006.01)
*H01L 33/08* (2010.01)

(52) U.S. Cl.
USPC ............... 257/59; 257/E29.003; 257/E33.005

(58) Field of Classification Search
USPC ............... 257/59, E29.003, E33.005
See application file for complete search history.

(56) References Cited

U.S. PATENT DOCUMENTS 7,294,854 B2 * 11/2007 Kim et al. ................... 257/59
7,884,368 B2 * 2/2011 Ishizaki et al. ............. 257/59

FOREIGN PATENT DOCUMENTS

| KR | 10-2001-0084330 | 9/2001 |
| KR | 10-2005-0042596 | 5/2005 |
| KR | 10-2010-0002899 | 1/2010 |

* cited by examiner

*Primary Examiner* — Matthew W Such
*Assistant Examiner* — Monica D Harrison
(74) *Attorney, Agent, or Firm* — Robert E. Bushnell, Esq.

(57) ABSTRACT

A display device includes a substrate; a gate wire including a gate electrode and a first capacitor electrode formed on the substrate; a gate insulating layer formed on the gate wire; a semiconductor layer pattern formed on the gate insulating layer, and including an active region overlapping at least a part of the gate electrode and a capacitor region overlapping at least a part of the first capacitor electrode; an etching preventing layer formed on a part of the active region of the semiconductor layer pattern; and a data wire including a source electrode and a drain electrode formed over the active region of the semiconductor layer from over the etching preventing layer, and separated with the etching preventing layer therebetween, and a second capacitor electrode formed on the capacitor region of the semiconductor layer.

13 Claims, 12 Drawing Sheets

DISPLAY DEVICE AND METHOD FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Oct. 18, 2010 and there duly assigned Serial No. 10-2010-0101414.

BACKGROUND OF THE INVENTION

1. Field of the Invention

The present invention relates generally to a display device and a manufacturing method thereof.

2. Description of the Related Art

Most flat display devices, such as a liquid crystal display (LCD) and an organic light emitting diode (OLED) display, include thin film transistors (TFTs) and capacitors.

The thin film transistor has a bottom gate structure for positioning a gate electrode below a semiconductor layer and a top gate structure for positioning a gate electrode above the semiconductor layer. In the case of the thin film transistor of the bottom gate structure, a semiconductor layer may be easily damaged while patterning a source electrode and a drain electrode on the semiconductor layer.

Therefore, the semiconductor layer is prevented from being damaged by forming an etching preventing layer in a channel region between the source electrode and the drain electrode.

However, another process is problematically added when the etching preventing layer is formed.

The above information disclosed in this Background section is only for enhancement of an understanding of the background of the described technology, and therefore it may contain information that does not form the prior art which is already known in this country to a person of ordinary skill in the art.

SUMMARY OF THE INVENTION

The present invention has been developed in an effort to provide a display device including an etching preventing layer, and to simplify the manufacturing process.

The present invention has also been developed in an effort to provide a manufacturing method of the display device.

An exemplary embodiment of the invention provides a display device comprising: a substrate; a gate wire including a gate electrode and a first capacitor electrode formed on the substrate; a gate insulating layer formed on the gate wire; a semiconductor layer pattern formed on the gate insulating layer, and including an active region overlapping at least apart of the gate electrode and a capacitor region overlapping at least a part of the first capacitor electrode; an etching preventing layer formed on a part of the active region of the semiconductor layer pattern; and a data wire, including a source electrode and a drain electrode, formed over the active region of the semiconductor layer from over the etching preventing layer, and separated with the etching preventing layer therebetween, and a second capacitor electrode formed on the capacitor region of the semiconductor layer.

The semiconductor layer pattern and the data wire are formed with the same pattern except at a part overlapping the etching preventing layer.

The etching preventing layer has different etching selection ratios from at least one of the semiconductor layer pattern and the data wire.

The gate wire further includes a first connection line, the data wire further includes a second connection line overlapping at least a part of the first connection line, and the semiconductor layer pattern further includes a connecting region disposed below the second connection line.

The display further includes a connecting contact hole penetrating the connecting region of the gate insulating layer and the semiconductor layer pattern between the first connection line and the second connection line, and the first connection line contacts the second connection line through the connecting contact hole.

The second connection line of the data wire and the connecting region of the semiconductor layer pattern are formed with the same pattern except at the connecting contact hole.

The second connection line of the data wire and the connecting region of the semiconductor layer pattern are formed with the same pattern.

The display further includes a planarization layer formed on the data wire, a drain contact hole for revealing a part of the drain electrode by penetrating the planarization layer, and a capacitor contact hole for revealing a part of the second capacitor electrode by penetrating the planarization layer.

The display further includes a pixel electrode contacting the drain electrode and the second capacitor electrode through the drain contact hole and the capacitor contact hole, respectively.

The display includes a first connecting contact hole for revealing a part of the first connection line by penetrating the planarization layer and the gate insulating layer, and a second connecting contact hole for revealing a part of the second connection line by penetrating the planarization layer.

The display further includes a connecting member formed on the planarization layer, and connecting the first connection line and the second connection line through the first connecting contact hole and the second connecting contact hole, respectively.

In the display device, the semiconductor layer pattern is made of an oxide semiconductor.

The semiconductor layer includes oxygen (O) and at least one of gallium (Ga), indium (In), zinc (Zn), hafnium (Hf), and tin (Sn).

Another embodiment of the invention provides a method for manufacturing a display device comprising: providing a substrate; forming a gate wire, including a gate electrode and a first capacitor electrode, on the substrate; forming a gate insulating layer on the gate wire; forming a semiconductor layer on the gate insulating layer; forming an etching preventing layer which overlaps a part of the gate electrode on the semiconductor layer; forming a data metal layer over the semiconductor layer from over the etching preventing layer; and forming a data wire, including a source electrode, a drain electrode, and a second capacitor electrode, and a semiconductor layer pattern, including an active region and a capacitor region, by patterning the data metal layer and the semiconductor layer.

The active region of the semiconductor layer pattern overlaps at least a part of the gate electrode, the source electrode and the drain electrode are formed over the active region of the semiconductor layer from over the etching preventing layer, and the source electrode and the drain electrode are separated with the etching preventing layer therebetween.

The semiconductor layer pattern and the data wire are formed with the same pattern, except at a part which overlaps the etching preventing layer.

The etching preventing layer has different etching selection ratios from at least one of the semiconductor layer pattern and the data wire.

The data wire and the semiconductor layer pattern are formed through a photolithography process using a mask.

The gate wire further includes a first connection line.

The data wire further includes a second connection line overlapping at least a part of the first connection line.

The semiconductor layer pattern further includes a connecting region disposed below the second connection line.

The method further includes the step, before forming the data metal layer, of forming a connecting contact hole for partially revealing the first connection line by penetrating the semiconductor layer and the gate insulating layer.

The second connection line contacts the first connection line through the connecting contact hole.

The second connection line of the data wire and the connecting region of the semiconductor layer pattern are formed with the same pattern except for the connecting contact hole.

The second connection line of the data wire and the connecting region of the semiconductor layer pattern are formed with the same pattern.

The method further includes forming a planarization layer on the data wire, forming a drain contact hole for partially revealing the drain electrode by penetrating the planarization layer, and forming a capacitor contact hole for partially revealing the second capacitor electrode.

The method further includes forming a pixel electrode on the planarization layer.

The pixel electrode contacts the drain electrode and the second capacitor electrode through the drain contact hole and the capacitor contact hole, respectively.

When the drain contact hole and the capacitor contact hole are formed, a first connecting contact hole for partially revealing the first connection line by penetrating the planarization layer and the gate insulating layer, and a second connecting contact hole for partially revealing the second connection line by penetrating the planarization layer, are formed.

When the pixel electrode is formed, a connecting member for connecting the first connection line and the second connection line through the first connecting contact hole and the second connecting contact hole, respectively, is formed on the planarization layer.

In the display device manufacturing method, the semiconductor layer pattern is made of an oxide semiconductor.

The semiconductor layer includes oxygen (O) and at least one of gallium (Ga), indium (In), zinc (Zn), hafnium (Hf), and tin (Sn).

According to an embodiment of the invention, the display device can have a simplified structure with an efficiently improved aperture ratio.

Furthermore, the whole manufacturing process of the display device can be simplified.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
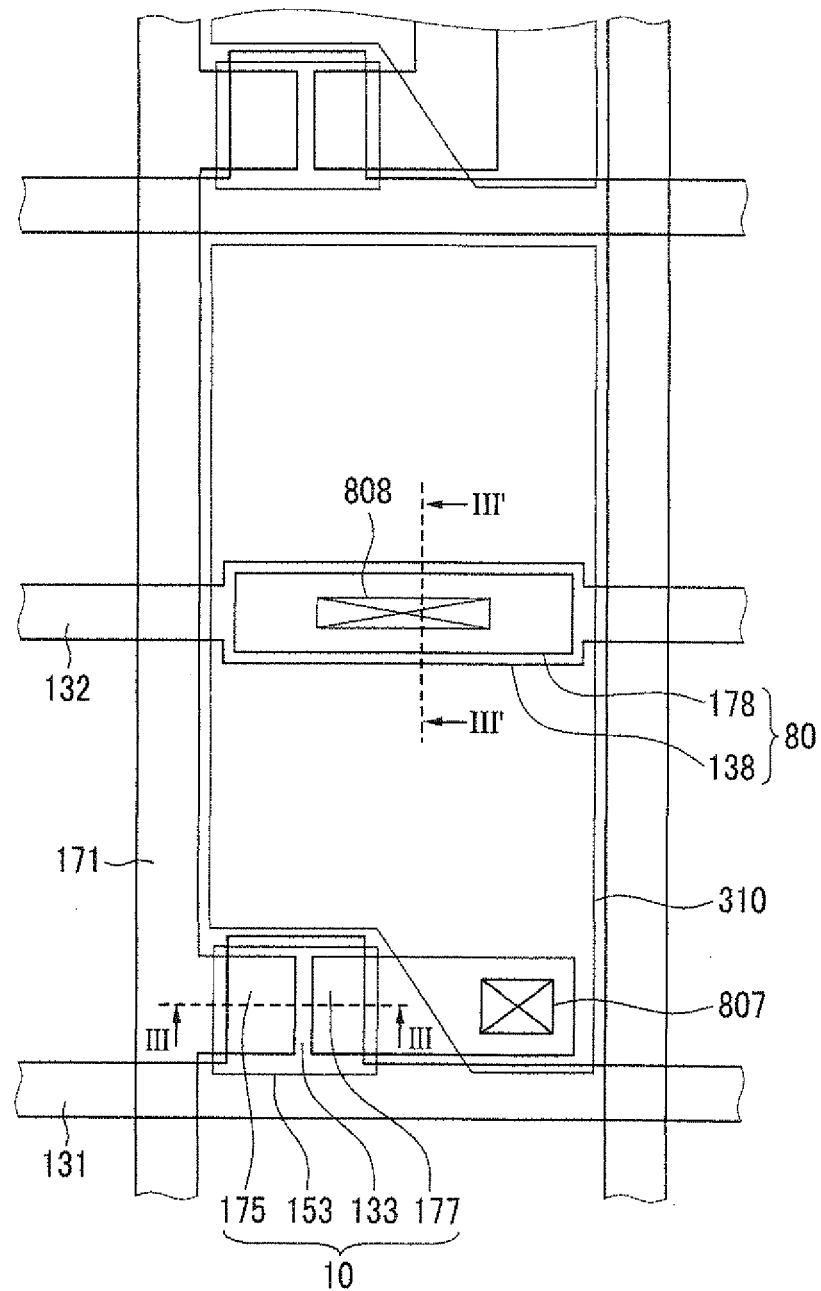
FIG. 1 shows a layout view of a pixel of a display device according to a first exemplary embodiment of the invention.

In the following detailed description, only certain exemplary embodiments have been shown and described, simply by way of illustration. As those skilled in the art will realize, the described embodiments may be modified in various different ways, all without departing from the spirit or scope of the present invention. Like reference numerals designate like elements throughout the specification. The second exemplary embodiment will describe parts different from those of the first exemplary embodiment. The size and thickness of each component shown in the drawings are arbitrarily shown for an understanding and ease of description, but the invention is not limited thereto. In the drawings, the thickness of layers, films, panels, regions, etc., are exaggerated for clarity. It will be understood that, when an element such as a layer, film, region, or substrate is referred to as being "on" another element, it can be directly on the other element or intervening elements may also be present.

A display device according to a first exemplary embodiment of the invention will now be described with reference to FIG. 1 thru FIG. 3.

FIG. 1 shows a layout view of a pixel of a display device according to a first exemplary embodiment of the invention; FIG. 2 shows a layout view of a pad connector of a display device according to a first exemplary embodiment of the invention; and FIG. 3 shows a partial cross-sectional view with respect to lines III-III and III'-III' of FIG. 1 and line III"-III" of FIG. 2.

Figure 2:
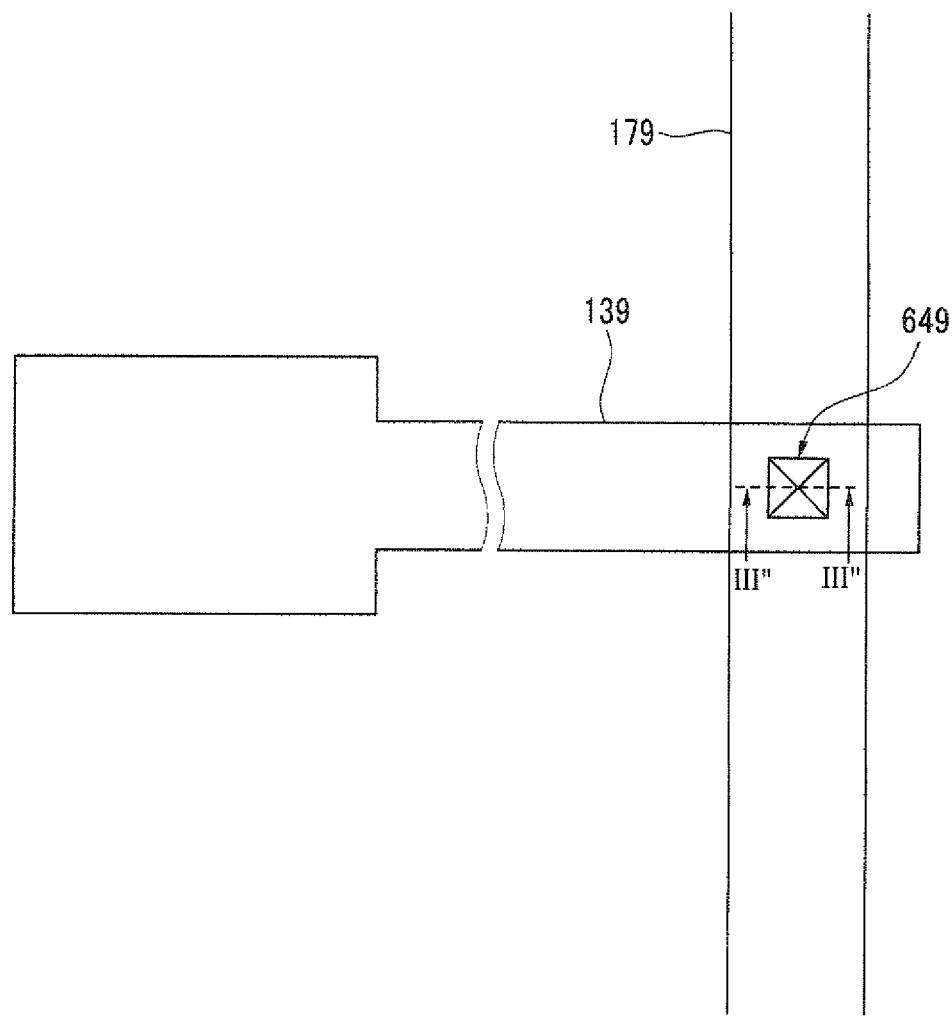
FIG. 2 shows a layout view of a pad connector of a display device according to a first exemplary embodiment of the invention.
Figure 3:
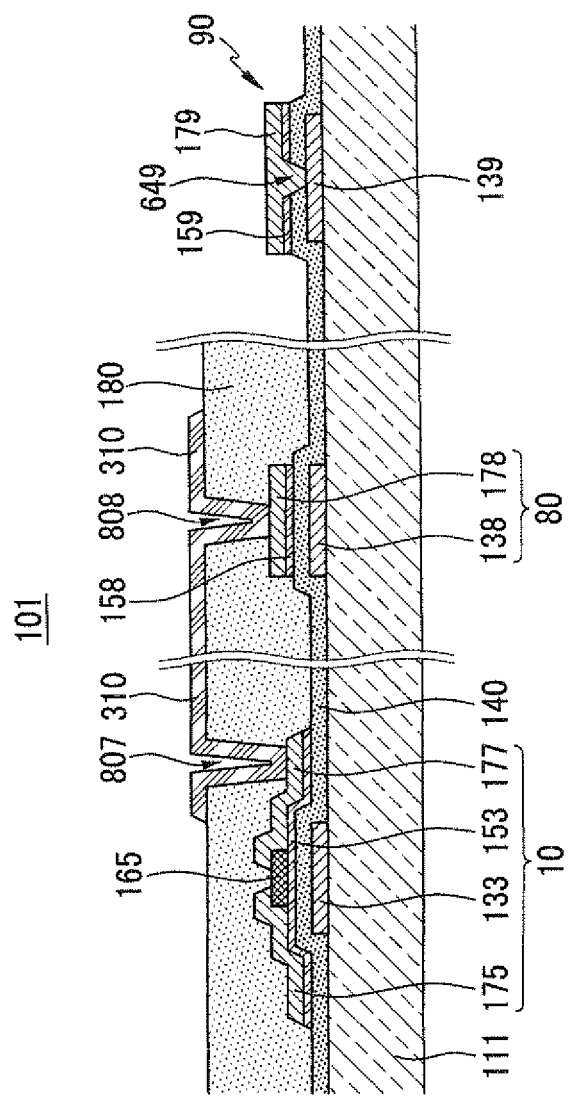
FIG. 3 shows a partial cross-sectional view with respect to lines III-III and III'-III' of FIG. 1 and line III"-III" of FIG. 2.

FIG. 1 thru FIG. 3 show a liquid crystal display (LCD) for the display device 101, and the first exemplary embodiment is not limited thereto. Therefore, an organic light emitting diode (OLED) display can be used for the display device 101 within the range of skill easily modifiable by a person of skill in the art.

The substrate 111 of FIG. 3 can be formed as various insulating substrates made of glass, quartz, ceramic, and plastic. Also, although not shown, a buffer layer can be formed on the substrate 111. The buffer layer can be formed with a single layer or multiple layers including at least one insulation layer, such as a silicon oxide layer and a silicon nitride layer, by using chemical vapor deposition or physical vapor deposition. The buffer layer prevents spreading or penetration of moisture or impurities generated on the substrate 111 and smoothes the surface.

Gate wires 131, 132, 133, 138, and 139 are formed on the substrate 111. The gate wires include a gate line 131, a capacitor line 132, a gate electrode 133, and a first capacitor electrode 138. The gate wires may also include a first connection line 139.

Additionally, the gate wires 131, 132, 133, 138, and 139 are formed to include one of various metallic materials, such as molybdenum (Mo), chromium (Cr), aluminum (Al), silver (Ag), titanium (Ti), tantalum (Ta), and tungsten (W) known to a person skilled in the art.

The gate electrode 133 is connected to the gate line 131, and the first capacitor electrode 138 is connected to the capacitor line 132. The gate line 131 and the capacitor line 132 are disposed in parallel with each other.

The capacitor line 132 may function as a shield. That is, the capacitor line 132 improves image quality of the display device 101 by covering a region where the electric field is non-uniformly formed in steps.

The first connection line 139 is formed on the edge of the display device 101, and is connected to a fan-out line or a pad (not shown).

A gate insulating layer 140 covers the gate wires 131, 132, 133, 138, and 139. The gate insulating layer 140 is formed to include various insulation materials, such as tetraethyl orthosilicate (TEOS), SiNx, and $SiO_2$ known to a person skilled in the art.

Semiconductor layer patterns 153, 158, and 159 are formed on the gate insulating layer 140, and are disposed on partial regions of the gate wires 131, 132, 133, and 138. In detail, the semiconductor layer patterns include an active region 153, a capacitor region 158, and a connection region 159. The active region 153 is disposed so as to partially overlap the gate electrode 133. The capacitor region 158 is disposed so as to partially overlap the first capacitor electrode 138. The connection region 159 is disposed so as to partially overlap the first connection line 139.

Also, the semiconductor layer patterns 153, 158, and 159 are made of an oxide semiconductor. In detail, the semiconductor layer patterns 153, 158, and 159 may include oxygen (O) and at least one of gallium (Ga), indium (In), zinc (Zn), hafnium (Hf), and tin (Sn). However, the first exemplary embodiment is not restricted to the above description. Hence, the semiconductor layer patterns 153, 158, and 159 can be made of silicon materials.

The semiconductor layer patterns 153, 158, and 159 made of the oxide semiconductor have relatively high electron mobility and reliability compared to those made of amorphous silicon, have excellent uniformity compared to those made of polysilicon, and have a simpler manufacturing process.

The display device 101 according to the first exemplary embodiment further includes a connecting contact hole 649 which penetrates both the connecting region 159 of the semiconductor layer patterns 153, 158, and 159 and the gate insulating layer 140, and which reveals part of the first connection line 139.

An etching preventing layer 165 is formed on a part of the active region 153 of the semiconductor layer patterns 153, 158, and 159. The etching preventing layer 165 has different etching selection ratios with respect to at least one of the semiconductor layer patterns 153, 158, and 159 and the data wires 171, 175, 177, 178, and 179 (to be described below), and prevents the active region 153 of the semiconductor layer patterns 153, 158, and 159 from being damaged while the data wires 171, 175, 177, 178, and 179 are formed.

The data wires 171, 175, 177, 178, and 179 are formed on the semiconductor layers 153, 158, and 159 and the etching preventing layer 165. The data wires include a data line 171, a source electrode 175, a drain electrode 177, and a second capacitor electrode 178. The data wires further include a second connection line 179. The second connection line 179 at least partially overlaps the first connection line 139.

The source electrode 175 and the drain electrode 177 are formed from the etching preventing layer 165 to the active regions 153 of the semiconductor layer patterns 153, 158, and 159. The source electrode 175 is connected to the data line 171, and the source electrode 175 is separated from the drain electrode 177 with the etching preventing layer 165 therebetween. That is, the channel region between the source electrode 175 and the drain electrode 177 overlaps the etching preventing layer 165. The etching preventing layer 165 prevents the active regions 153 of the semiconductor layer patterns 153, 158, and 159 from being damaged while a channel region is formed between the source electrode 175 and the drain electrode 177. The source electrode 175 and the drain electrode 177 are formed in the same pattern as the active regions 153 of the semiconductor layer patterns 153, 158, and 159, excluding the part overlapping the etching preventing layer 165.

The second capacitor electrode 178 is formed on the capacitor region 158 of the semiconductor layer patterns 153, 158, and 159. The second capacitor electrode 178 is formed in the same pattern as the capacitor regions 158 of the semiconductor layer patterns 153, 158, and 159.

The second connection line 179 is formed on the connecting region 159 of the semiconductor layer patterns 153, 158, and 159. The second connection line 179 is formed in the same pattern as the connecting region 159 of the semiconductor layer patterns 153, 158, and 159, except at the connecting contact hole 649. The second connection line 179 contacts the first connection line 139 through the connecting contact hole 649.

Accordingly, the data wires 171, 175, 177, 178, and 179 and the semiconductor layer patterns 153, 158, and 159 are formed in substantially the same pattern. That is, the semiconductor layer patterns 153, 158, and 159 are formed in the same pattern as the data wires 171, 175, 177, 178, and 179, except for the part overlapping the etching preventing layer 165 and the connecting contact hole 649. Hereinafter, substantially the same pattern excludes the part overlapping the etching preventing layer 165 and the connecting contact hole 649.

Therefore, although not shown, part of the semiconductor layer patterns 153, 158, and 159 are disposed below the data line 171.

Hence, since the data wires 171, 175, 177, 178, and 179 and the semiconductor layer patterns 153, 158, and 159 have substantially the same pattern according to the first exemplary embodiment, they can be formed together through a photolithography process using one mask. Thus, the entire manufacturing process of the display device 101 can be simplified.

Also, in a manner similar to the gate wires 131, 132, 133, 138, and 139, the data wires 171, 175, 177, 178, and 179 are formed to include at least one of various metallic materials, such as molybdenum (Mo), chromium (Cr), aluminum (Al), silver (Ag), titanium (Ti), tantalum (Ta), and tungsten (W) as is well known to a person skilled in the art.

The gate electrode 133, the active region 153, the source electrode 175, and the drain electrode 177 of the semiconductor layer patterns 153, 158, and 159 form a thin film transistor 10.

Also, the first capacitor electrode 138, the second capacitor electrode 178, and the gate insulating layer 140 disposed therebetween form a capacitor 80. In this instance, the gate insulating layer 140 is a dielectric material.

A planarization layer 180 is formed on the data wires 171, 175, 177, 178, and 179. However in the first exemplary embodiment, the planarization layer 180 on the second connection line 179 of the data wires 171, 175, 177, 178, and 179 can be removed if needed. FIG. 3 shows the state in which the planarization layer 180 on the second connection line 179 is removed.

The planarization layer 180 is formed with an organic material having an excellent planarization characteristic. For example, the planarization layer 180 may be an organic layer with photosensitivity. However, the first exemplary embodiment is not restricted thereto, and the planarization layer 180 can be formed with an inorganic layer or a combination of an inorganic layer and an organic layer.

The display device 101 further includes a drain contact hole 807 partially revealing the drain electrode 177, and passing through the planarization layer 180, and a capacitor contact hole 808 partially revealing the second capacitor electrode 178.

A pixel electrode 310 is formed on the planarization layer 180. The pixel electrode 310 contacts the drain electrode 177 and the second capacitor electrode 178 through the drain contact hole 807 and the capacitor contact hole 808, respectively. However, the first exemplary embodiment is not restricted thereto. Therefore, the capacitor contact hole 808 may not be formed, and the pixel electrode 310 may not directly contact the second capacitor electrode 178. In this instance, the second capacitor electrode 178 can be electrically connected to the drain electrode 177 or the pixel electrode 310 through another means.

The pixel electrode 310 includes at least one transparent conductive layer, such as indium tin oxide (ITO), indium zinc oxide (IZO), zinc indium tin oxide (ZITO), gallium indium tin oxide (GITO), indium oxide ($In_2O_3$), zinc oxide (ZnO), gallium zinc oxide (GZO), fluorine tin oxide (FTO), and aluminum-doped zinc oxide (AZO).

Furthermore, a liquid crystal layer (not shown) may be disposed on the pixel electrode 310, but the first exemplary embodiment is not limited thereto. That is, an organic emission layer (not shown) can be disposed on the pixel electrode 310.

In addition, the planarization layer 180 may have steps because of the capacitor contact hole 808, and a non-uniform electric field may be formed because of the steps so that the liquid crystal molecular arrangement of the liquid crystal layer (not shown) disposed on the pixel electrode 310 may be disordered in an undesired direction.

However, in the first exemplary embodiment, since the capacitor contact hole 808 is formed on the second capacitor electrode 178, the second capacitor electrode 178 blocks the stepped region in which the electric field is non-uniformly formed and prevents deterioration of the quality of images displayed by the display device 101.

However, the configuration of the display device 101 is not restricted thereto. That is, the first exemplary embodiment has a basic configuration in which active regions 153 of the semiconductor layers 153, 158, and 159 are disposed on the gate electrode 133, an etching preventing layer 165 is formed on the active region 153, and the data wires 171, 175, 177, 178, and 179 and the semiconductor layer patterns 153, 158, and 159 substantially have the same pattern, and may further have various configurations easily changeable by a person skilled in the art.

By virtue of the above-described configuration, the display device 101 according to the first exemplary embodiment provides a configuration for stably preventing the active layer 153 of the semiconductor layer patterns 153, 158, and 159 from being damaged, and simplifying the manufacturing process by including the etching preventing layer 165.

In detail, the semiconductor layer patterns 153, 158, and 159, the etching preventing layer 165, and the data wires 171, 175, 177, 178, and 179 are formed through a photolithography process using two sheets of masks.

Hence, since the whole configuration and manufacturing process can be simplified according to the first exemplary embodiment, an enlarged display device 101 can effectively maintain high productivity.

FIG. 4 thru FIG. 7 sequentially show partial cross-sectional views of a display device manufacturing method of FIG. 3.

A method of manufacturing the display device 101 according to a first exemplary embodiment will now be described with reference to FIG. 4 thru FIG. 7.

Figure 4:
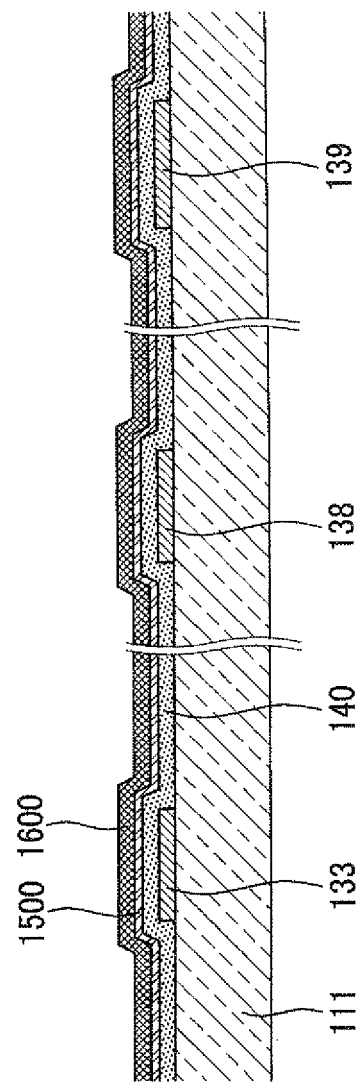
FIG. 4 thru FIG. 7 sequentially show partial cross-section III-III and III'-III' nal views of a display device manufacturing method of FIG. 3.

As shown in FIG. 4, a substrate 111 is made of glass, quartz, ceramic, or plastic, and gate wires, including the gate line 131, the gate electrode 133, the capacitor line 132, the first capacitor electrode 138 and the first connection line 139, are formed on the substrate 111. A photolithography process using a single mask is used while the gate wires 131, 132, 133, 138, and 139 are formed.

The gate insulating layer 140 for covering the gate wires 131, 132, 133, 138, and 139 is formed, and a semiconductor layer 1500 made of an oxide semiconductor and an etching preventing layer intermediate 1600 are sequentially formed on the gate insulating layer 140.

Figure 5:
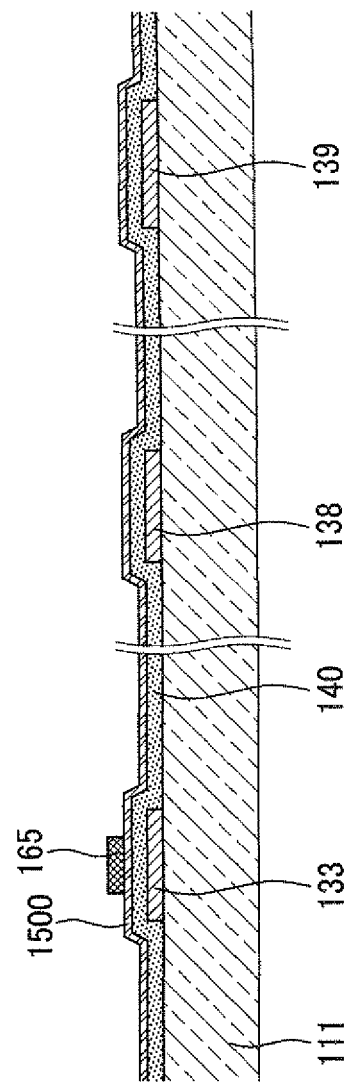

As shown in FIG. 5, an etching preventing layer 165 is formed by patterning the etching preventing layer intermediate 1600 of FIG. 4, during which the photolithography process using a single mask is used.

The etching preventing layer 165 is formed so as to partially overlap the gate electrode 133. The etching preventing layer 165 is made of a material having different etching selection ratios with respect to at least one of the data wires 171, 175, 177, 178, and 179 and the semiconductor layer patterns 153, 158, and 159.

Figure 6:
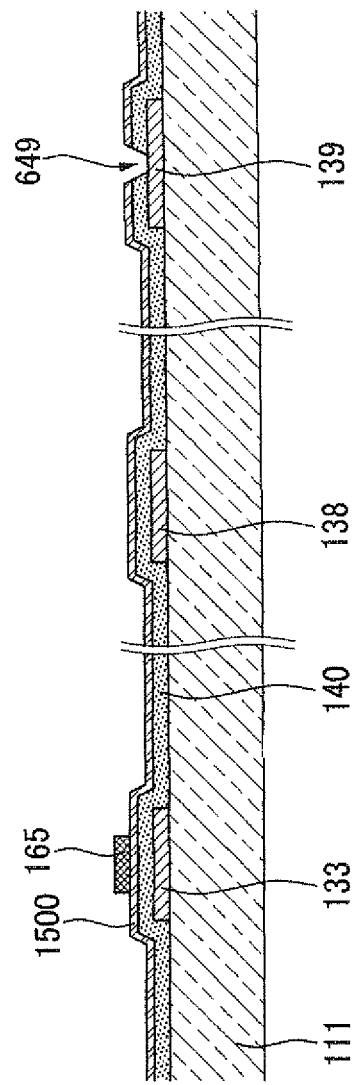

As shown in FIG. 6, the gate insulating layer 140 and the semiconductor layer 1500 are etched on a partial region of the first connection line 139 so as to form a connecting contact hole 649, during which the photolithography process using a single mask is used. The connecting contact hole 164 may be omitted if needed.

Also, differing from the above description, the first exemplary embodiment can form the connecting contact hole 649 before the etching preventing layer 165 is formed.

Figure 7:
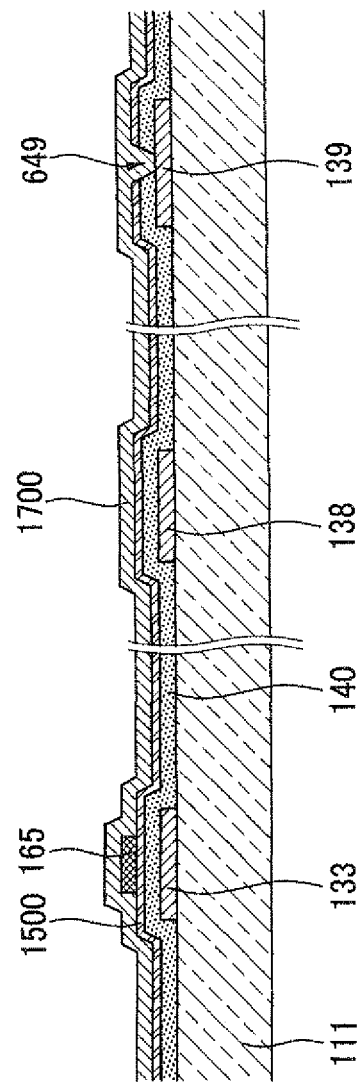

As shown in FIG. 7, a data metal layer 1700 is formed on the semiconductor layer 1500. In this instance, the data metal layer 1700 contacts the first connection line 139 through the connecting contact hole 649.

The data wires 171, 175, 177, 178, and 179 and the semiconductor layer patterns 153, 158, and 159 of FIG. 3 are formed by patterning the data metal layer 1700 and the semiconductor layer 1500 of FIG. 7 through the photolithography process using a single mask.

In this instance, since the etching preventing layer 165 has different etching selection ratios with respect to at least one of the semiconductor layer patterns 153, 158, and 159 and the data wires 171, 175, 177, 178, and 179, the active region 153 of the semiconductor layer patterns 153, 158, and 159 is prevented from being damaged while the source electrode 175 and the drain electrode 177 are formed. When there is no etching preventing layer 165 according to the first exemplary embodiment, the active region 153 of the semiconductor layer patterns 153, 158, and 159 is separated like the source electrode 175 and the drain electrode 177.

Also, since the semiconductor layer patterns 153, 158, and 159 and the data wires 171, 175, 177, 178, and 179 can be formed through the photolithography process using one mask, the entire manufacturing process of the display device 101 can be simplified. The semiconductor layer patterns 153, 158, and 159, the etching preventing layer 165, and the data wires 171, 175, 177, 178, and 179 can be formed through the photolithography process using two masks.

Furthermore, the number of masks used for manufacturing the display device 101 can be efficiently reduced by not using relatively expensive masks, such as a halftone exposure mask or a slit pattern mask, according to the first exemplary embodiment. Particularly, the halftone exposure mask or the slit pattern mask is not needed in the process for forming the data wires 171, 175, 177, 178, and 179 and the semiconductor layer patterns 153, 158, and 159 together.

By the above-described manufacturing method, the display device 101 according to the first exemplary embodiment can be manufactured.

Figure 8:
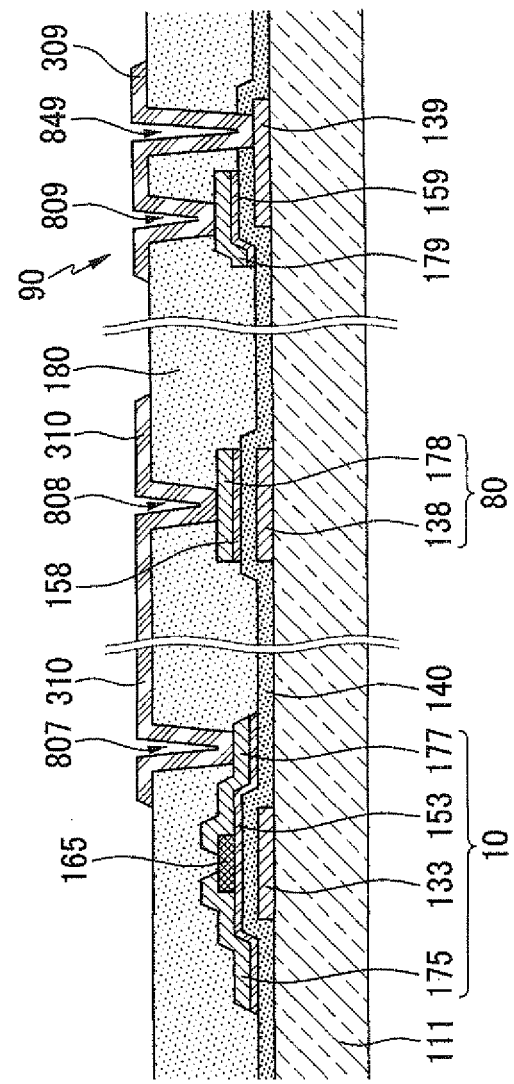
FIG. 8 shows a partial cross-sectional view of a display device according to a second exemplary embodiment of the invention.
Figure 9:
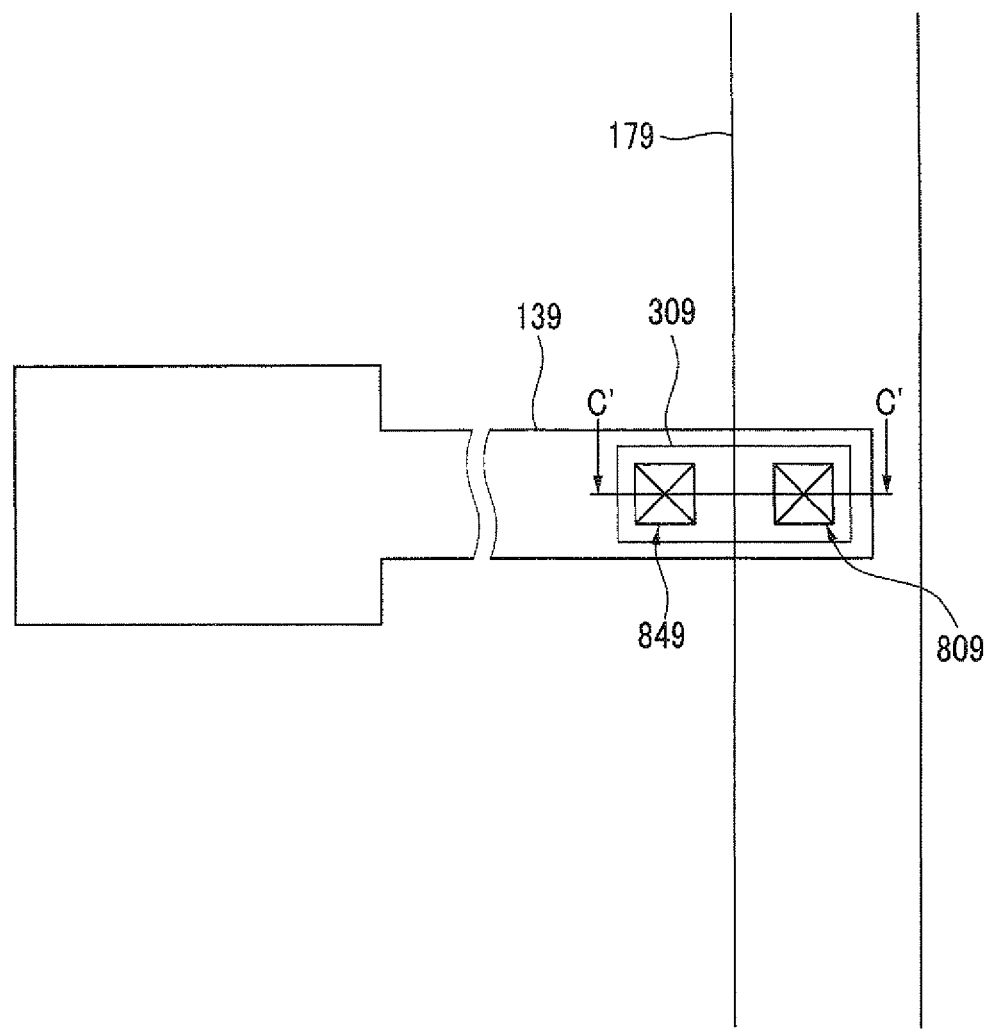
FIG. 9 shows a layout view of a pad connector of a display device of FIG. 8.

FIG. 8 shows a partial cross-sectional view of a display device according to a second exemplary embodiment of the invention; and FIG. 9 shows a layout view of a pad connector of a display device of FIG. 8.

A display device 102 according to a second exemplary embodiment of the invention will now be described with reference to FIG. 1, FIG. 8, and FIG. 9.

As shown in FIG. 8 and FIG. 9, the display device 102 according to the second exemplary embodiment forms the second connection line 179 of the data wires 171, 175, 177, 178, and 179 and the connecting region 159 of the semiconductor layer patterns 153, 158, and 159 with the same pattern. That is, the contact hole is not formed in the connecting region 159 of the semiconductor layer pattern 153, 158, and 159 according to the second exemplary embodiment.

Furthermore, the display device 102 according to the second exemplary embodiment also includes a first connecting contact hole 849 for partially revealing the first connection line 139 by penetrating the planarization layer 180 and the gate insulating layer 140, a second connecting contact hole 809 for partially revealing the second connection line 179 by penetrating the planarization layer 180, and a connecting member 309 formed on the planarization layer 180 and connecting the first connection line 139 and the second connection line 179 through the first connecting contact hole 849 and the second connecting contact hole 809.

The connecting member 309 is formed with the same material as the pixel electrode 310 and through the same process.

In addition, the configuration of the thin film transistor 10 and the capacitor 80 corresponds to the first exemplary embodiment.

By the above-described configuration, the display device 102 according to the second exemplary embodiment can have a configuration in which the active layer 153 of the semiconductor layer patterns 153, 158, and 159 is stably prevented from being damaged, and the manufacturing process is further simplified, inclusive of the etching preventing layer 165. That is, the contact holes 949 and 809 for connecting the first connection line 139 and the second connection line 179 can be formed together when the drain contact hole 807 for connecting the pixel electrode 310 and the drain electrode 177 is formed without performing the photolithography process using an additional mask.

Figure 10:
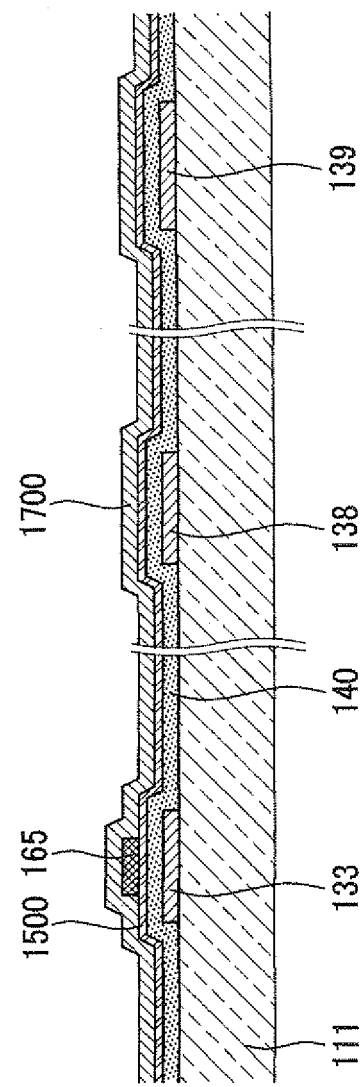
FIG. 10 thru FIG. 12 sequentially show partial cross-sectional views of a display device manufacturing method of FIG. 8.
Figure 11:
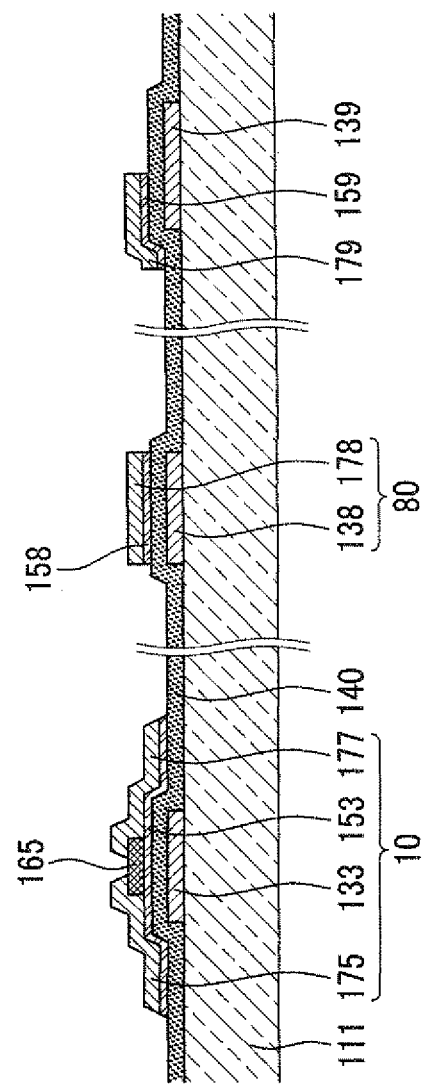
Figure 12:
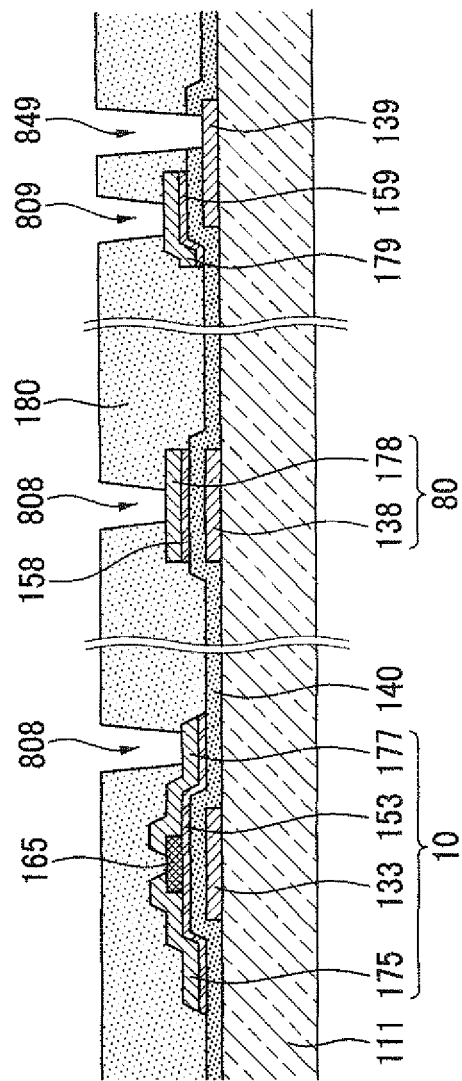

FIG. 10 thru FIG. 12 sequentially show partial cross-sectional views of a display device manufacturing method of FIG. 8.

A method of manufacturing display device 102 according to a second exemplary embodiment of the invention will now be described with reference to FIG. 10 thru FIG. 12.

The processes up to the process for forming the semiconductor layer 1500 on the gate insulating layer 140 correspond to the first exemplary embodiment. As shown in FIG. 10, in the second exemplary embodiment, differing from the first exemplary embodiment, the process for forming the contact hole penetrating the semiconductor layer 1500 and the gate insulating layer 140 on apart of the first connection line 139 is omitted, and a data metal layer 1700 for covering the etching preventing layer 165 and the semiconductor layer 1500 is formed.

As shown in FIG. 11, the data wires 171, 175, 177, 178, and 179 and the semiconductor layer patterns 153, 158, and 159 are formed through the photolithography process using a single mask. In this regard, the relatively expensive halftone exposure mask or the slit pattern mask is not needed.

As shown in FIG. 12, a planarization layer 180 for covering the data wires 171, 175, 177, 178, and 179 is formed, and a drain contact hole 807, a capacitor contact hole 808, a first connecting contact hole 849, and a second connecting contact hole 809 are formed through the photolithography process using a mask.

As shown in FIG. 8, a pixel electrode 310 and a connecting member 309 are formed through the photolithography using a mask.

By the above-described manufacturing method, the display device 102 according to the second exemplary embodiment can be manufactured. Thus, since the drain contact hole 807, the capacitor contact hole 808, the first connecting contact hole 849, and the second connecting contact hole 809 can be formed together through the photolithography using a mask, the number of masks used for manufacturing the display device 101 is reduced.

While this disclosure has been described in connection with what is presently considered to be practical exemplary embodiments, it is to be understood that the invention is not limited to the disclosed embodiments but, on the contrary, is intended to cover various modifications and equivalent arrangements included within the spirit and scope of the appended claims.

What is claimed is:

1. A display device, comprising:
a substrate;
a gate wire including a gate electrode and a first capacitor electrode formed on the substrate;
a gate insulating layer formed on the gate wire;
a semiconductor layer pattern formed on the gate insulating layer, the semiconductor layer pattern including an active region overlapping at least a part of the gate electrode and a capacitor region overlapping at least a part of the first capacitor electrode;
a data wire including a source electrode and a drain electrode that are disposed spaced-apart from each other and are formed over the active region of the semiconductor layer, the data wire including a second capacitor electrode formed on the capacitor region of the semiconductor layer; and
an etching preventing layer formed on a part of the active region of the semiconductor layer pattern and continuously extending from a first end of the etching preventing layer that is interposed between the active region of the semiconductor layer pattern and the source electrode to a second end of the etching preventing layer that is interposed between the active region of the semiconductor layer pattern and the drain electrode.

2. The display device of claim 1, wherein the semiconductor layer pattern and the data wire are formed with a same pattern except for a part overlapping the etching preventing layer.

3. The display device of claim 2, wherein the etching preventing layer has different etching selection ratios with respect to at least one of the semiconductor layer pattern and the data wire.

4. The display device of claim 2, wherein the gate wire further includes a first connection line, the data wire further includes a second connection line overlapping at least a part of the first connection line, and the semiconductor layer pattern further includes a connecting region disposed below the second connection line.

5. The display device of claim 4, further including a connecting contact hole penetrating the connecting region of the gate insulating layer and the semiconductor layer pattern between the first connection line and the second connection line, wherein the first connection line contacts the second connection line through the connecting contact hole.

6. The display device of claim 5, wherein the second connection line of the data wire and the connecting region of the semiconductor layer pattern are formed with a same pattern except at the connecting contact hole.

7. The display device of claim 4, wherein the second connection line of the data wire and the connecting region of the semiconductor layer pattern are formed with a same pattern.

8. The display device of claim 7, further comprising:
a planarization layer formed on the data wire;
a drain contact hole for revealing a part of the drain electrode by penetrating the planarization layer; and
a capacitor contact hole for revealing a part of the second capacitor electrode by penetrating the planarization layer.

9. The display device of claim 8, further comprising a pixel electrode contacting the drain electrode and the second capacitor electrode through the drain contact hole and the capacitor contact hole.

10. The display device of claim 8, further comprising:
a first connecting contact hole for revealing a part of the first connection line by penetrating the planarization layer and the gate insulating layer; and
a second connecting contact hole for revealing a part of the second connection line by penetrating the planarization layer.

11. The display device of claim 10, further comprising a connecting member formed on the planarization layer and connecting the first connection line and the second connection line through the first connecting contact hole and the second connecting contact hole.

12. The display device of claim 1, wherein the semiconductor layer pattern is made of an oxide semiconductor.

13. The display device of claim 12, wherein the semiconductor layer includes oxygen (O) and at least one of gallium (Ga), indium (In), zinc (Zn), hafnium (Hf), and tin (Sn).

* * * * *